United States Patent
Taylor et al.

(10) Patent No.: US 9,470,919 B2
(45) Date of Patent: Oct. 18, 2016

(54) METHODS FOR PRODUCING A GLASS-BASED NON PLANAR DIGITAL DISPLAY

(71) Applicants: Joseph Taylor, Seattle, WA (US);
Cynthia Sue Bell, Kirkland, WA (US);
Rod G. Fleck, Bellevue, WA (US);
Kshitij Moghe, Issaquah, WA (US);
Paul O'Brien, Sammamish, WA (US)

(72) Inventors: Joseph Taylor, Seattle, WA (US);
Cynthia Sue Bell, Kirkland, WA (US);
Rod G. Fleck, Bellevue, WA (US);
Kshitij Moghe, Issaquah, WA (US);
Paul O'Brien, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 339 days.

(21) Appl. No.: 13/944,834

(22) Filed: Jul. 17, 2013

(65) Prior Publication Data
US 2014/0340609 A1    Nov. 20, 2014

Related U.S. Application Data

(60) Provisional application No. 61/823,332, filed on May 14, 2013.

(51) Int. Cl.
*G02F 1/1339* (2006.01)
*G02F 1/1333* (2006.01)

(52) U.S. Cl.
CPC ....... *G02F 1/133308* (2013.01); *G02F 1/1333* (2013.01); *G02F 2001/133325* (2013.01); *G02F 2001/133331* (2013.01); *G02F 2001/133388* (2013.01); *G02F 2202/28* (2013.01)

(58) Field of Classification Search
None
See application file for complete search history.

(56) References Cited

U.S. PATENT DOCUMENTS

| 8,305,743 | B2 | 11/2012 | Wu et al. |
| 8,310,614 | B2 * | 11/2012 | Sasaki .................. G02F 1/1333 349/158 |
| 2004/0130912 | A1 | 7/2004 | Miyashita |
| 2005/0117197 | A1 | 6/2005 | Ide |
| 2009/0160759 | A1 * | 6/2009 | Deane .................... G02F 1/167 345/107 |
| 2010/0073620 | A1 | 3/2010 | Yamaguchi et al. |

(Continued)

FOREIGN PATENT DOCUMENTS

| JP | 2002-351347 | 12/2002 |
| JP | 2004-288570 | 10/2004 |
| JP | 2010-145731 | 7/2010 |
| JP | 2011-085740 | 4/2011 |

OTHER PUBLICATIONS

"International Search Report & Written Opinion for PCT Patent Application No. PCT/US2014/037939", Mailed Sep. 23, 2014, 22 Pages. (MS# 339254.03).

(Continued)

*Primary Examiner* — Richard Kim
(74) *Attorney, Agent, or Firm* — Miia Sula; Judy Yee; Micky Minhas

(57) ABSTRACT

A method of producing a curved display for an electronic device comprises providing a substrate comprising a first curvable section comprising at least one flat glass member and a second longitudinally adjacent planar section, placing the curvable section in contact with a member having a curved surface, urging the curvable section towards the curved surface of the member and maintaining the curvable section in a curved configuration to thereby form the curved display having the adjacent planar section. A curved display and a mobile device having a curved display are also disclosed.

8 Claims, 11 Drawing Sheets

(56) References Cited

U.S. PATENT DOCUMENTS

2010/0103138 A1     4/2010    Huang et al.
2012/0151760 A1     6/2012    Steijner

OTHER PUBLICATIONS

Jo et al., "P-114: A Novel Curved LCD with Highly Durable and Slim Profile," *SID Symposium Digest of Technical Papers*, vol. 41, Issue 1, pp. 1671-1674 (May 2010).

"International Preliminary Report on Patentability Issued in PCT Application No. PCT/US2014/037939", Mailed Date: Jun. 25, 2015, 8 Pages. (MS# 339254.03).

"Second Written Opinion Issued in PCT Application No. PCT/US2014/037939", Mailed Date: Apr. 1, 2015, 12 Pages. (MS# 339254.03).

"Office Action Issued in European Patent Application No. 14729818.6," Mailed Date: Mar. 16, 2016, 5 Pages. (MS# 339254.05).

\* cited by examiner

FIG. 8
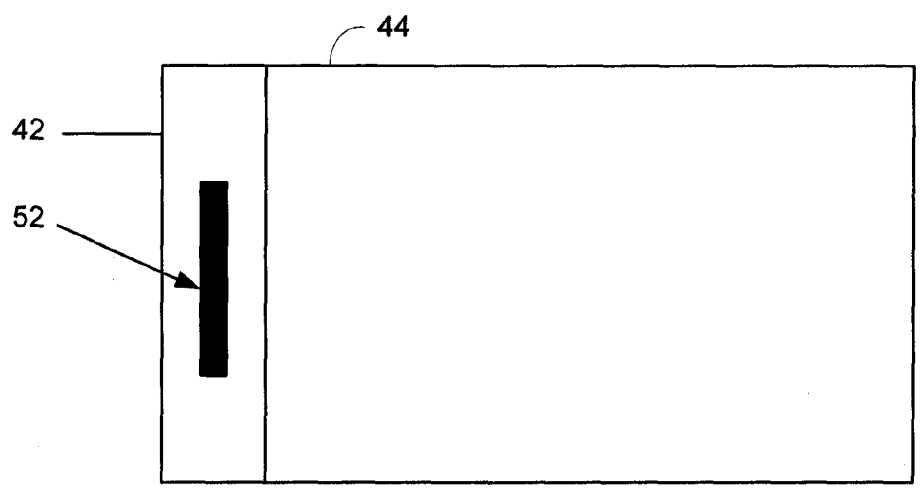
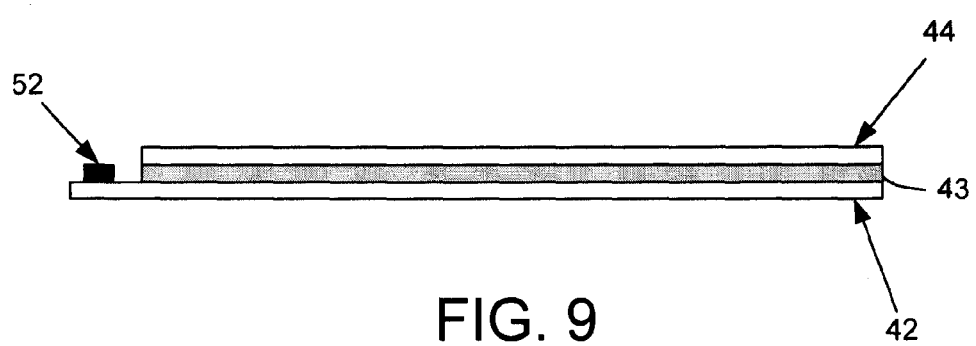
FIG. 9
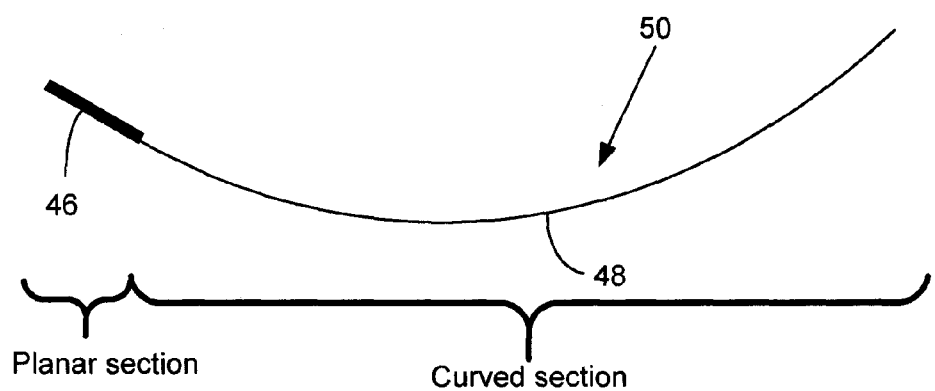
FIG. 10

METHODS FOR PRODUCING A GLASS-BASED NON PLANAR DIGITAL DISPLAY

RELATED APPLICATION

This application claims the benefit of U.S. Provisional Patent Application 61/823,332 filed on May 14, 2013, which is incorporated herein by reference.

BACKGROUND

Mobile devices having curved, non-planar displays can provide advantages in ergonomics compared to the typical planar displays that are widely used. Display manufacturers have attempted to build non-planar displays using both LCD and OLED technologies. Some have attempted fabricate such displays with glass substrates and others with plastic substrate materials. Manufacturing challenges have prevented mass production to date.

Early efforts to form curved LCDs faced difficulties with MURA artifacts and luminance nonuniformity. The MURA artifacts arose from bending forces affecting cell gap uniformity in the liquid crystal cell. The luminance non-uniformity resulted from the difficulty in creating curved backlights with suitably uniform backlight distribution.

OLEDs are not subject to cell gap or backlight concerns, but their stringent requirements for moisture and oxygen barriers present similarly formidable difficulties. Glass frit seals used with glass substrates are a viable barrier solution, but unsuited to curved display applications. Thus, the future for a curved OLED display will likely require specially manufactured plastic substrates. This approach will result in a higher cost of manufacturing and challenges in flexible moisture and oxygen barrier encapsulation.

Electrophoretic display media is well-adapted to curved devices. This technology is a good fit for e-readers, but its slow switching speed and poor colors make it a weak choice for the competitive mobile device display arena.

It would be advantageous to provide a non-planar or curved display and associated methods of production that address some of the drawbacks of the currently available technology.

SUMMARY

Described below are a method of producing a curved display, a curved display and a mobile device having a curved display that address some of the drawbacks of conventional approaches.

According to a method implementation, a method of producing a curved display for an electronic device comprises providing a substrate comprising a first curvable section comprising at least one flat glass member and a second longitudinally adjacent planar section, placing the curvable section in contact with a member having a curved surface, urging the curvable section towards the curved surface of the member, and maintaining the curvable section in a curved configuration to thereby form the curved display having the adjacent planar section.

The substrate can comprise a display module in contact with the flat glass member. The second planar section can comprise an operatively connected LED array, and the method can further comprise measuring brightness across the curvable section of substrate and moving the second planar section relative to the first curvable section to achieve a desired uniformity in measured brightness.

The member can be a curved cover lens transparent to UV light. Measuring brightness can comprise using a camera directed through the cover lens at the curvable section of the substrate. Maintaining the curved section in the curved configuration can comprise directing UV radiation on the curvable section of the substrate once the desired uniformity in measured brightness is achieved to cure UV sensitive adhesive applied between the curvable section and the curved cover lens.

Urging the substrate towards the curved surface of the member can comprise pressing an intermediate portion of the curvable section into contact with an aligned intermediate portion of the member and subsequently pressing outer portions of the curvable section on either side of the intermediate portion into contact with aligned outer portions of the member.

The curved configuration of the curvable section can have a radius of curvature of about 400 mm to about 1000 mm. The flat glass member can have a thickness of about 0.05 mm to about 0.30 mm.

The flat glass member can be a first flat glass member, and there can be a second flat glass member aligned with the first flat glass member.

The method can further comprise providing a resilient member in contact with the curvable section and urging the resilient member towards the member by exerting force through the curvable section. The resilient member can comprise closed cell foam.

The adjacent planar portion can be adapted to receive a circuit component.

In a method implementation, the at least one flat glass member can be a first flat glass member, the curvable section can comprise UV curable adhesive and a second flat glass member separated from the first flat glass member by a display module, and the method can include subjecting the curvable section to UV radiation, and wherein maintaining the curvable section in the curved configuration comprises removing the curvable section from the member after the UV adhesive has cured. The member can be transparent to UV radiation.

According to one implementation, a curved display for an electronic device, comprises a substrate comprising a first curved section and a longitudinally adjacent second planar section, the first curved section comprising at least one flat glass member bent into a curved configuration, wherein the second planar section comprises a circuit component mounted to a surface of the planar section.

The curved display can comprise a curved member attached to one side of the curved section to hold the curved section in the curved configuration. The curved member can be a first curved member, and the curved display can comprise a second curved member attached to an opposite side of the curved section. The first member can comprise a cover lens and the second member can comprise an internal chassis element.

According to one implementation, a mobile device having a curved display comprises a curved cover lens and a substrate comprising a first curved section and a longitudinally adjacent second planar section. The first curved section comprises an LCD display element having at least one flat glass member bent into a curved configuration to substantially follow the curvature of curved cover lens. The second planar section comprises an LED array operable to illuminate the LCD display element. The second planar section is movable to adjust uniformity of brightness in the LCD display before the substrate is affixed to the cover lens.

The first curved section can be adhered to the curved cover lens with a UV curable adhesive. The adhesive can be effective to fill a gap of about 0.02 mm to about 0.10 mm between the substrate and the curved cover lens.

BRIEF DESCRIPTION OF THE DRAWINGS

FIGS. 8 and 9 are top plan and side views of another implementation of the components of the curved display.

FIG. 10 is a schematic side view of the profile of the curved display.

DETAILED DESCRIPTION

New technology developments in the manufacture of glass sheets and other materials used to make displays have enabled extremely thin sheets to be manufactured, even as thin as 50-300 microns per sheet (0.050 to 0.300 mm).

For LCD displays, it has been found that displays made using these glass substrates can be bent into 2D curved shapes with bend radius of about 400 mm to about 1000 mm, or even about 200 mm to about 1000 mm, can be achieved without losing functionality. A bend radius in this range enables unique device form factors with advantages in display performance and ergonomics. In addition, such displays can be built inexpensively using existing LCD manufacturing equipment. These glass displays have an inherent optical advantage relative to plastic displays due to the superior optical properties of glass. These displays can be used in mobile devices to provide better ergonomics, low display power consumption, and a significant cost advantage relative to emerging plastic OLED technology.

Figure 1:
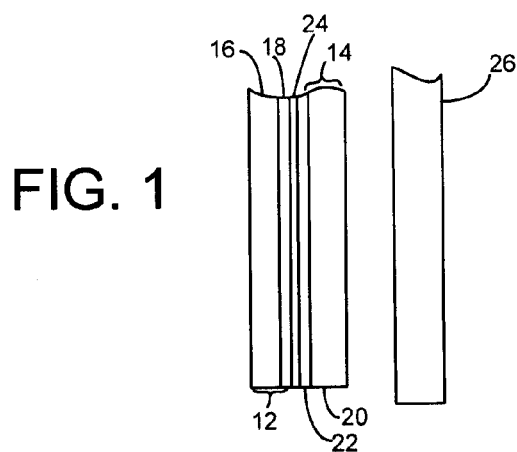
FIGS. 1, 2 and 3 are schematic side views of a substrate that includes a display module and a member before, during and after being assembled together into a curved display.
Figure 2:
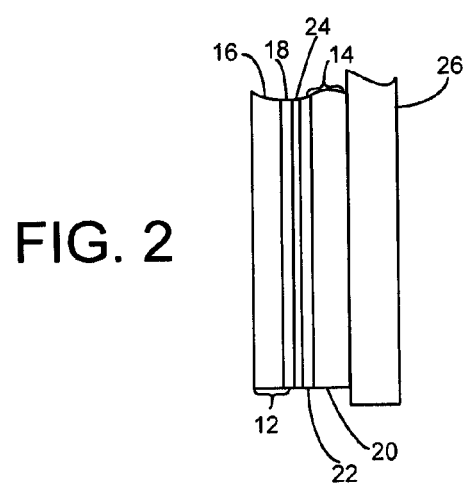
Figure 3:
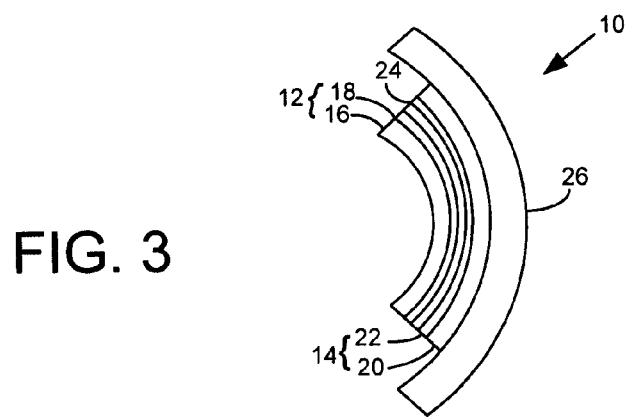

FIGS. 1-3 are schematic views showing important steps of assembling and fabricating a curved display 10. As shown in FIG. 1, at least a first substrate 12 is provided. Typically, each substrate includes at least one glass layer, as well as a display component layer. In the case of the first substrate 12, there is a first glass layer 16 and a thin film transistor layer 18 provided on the first glass layer 16.

In the example of FIG. 1, there is also a second substrate 14. The second substrate 14 has at least one glass layer, i.e., a second glass layer 20, and a display component layer, e.g., a color filter layer 22, provided on the second glass layer 20. In the illustrated embodiment, the first substrate 12 and the second substrate 14 are positioned on opposite sides of a liquid crystal layer 24. The illustrated configuration of the first and second substrates 12, 14 and the liquid crystal layer sealed between the substrates is also referred to herein as the display module.

FIG. 1 also shows a support or forming member 26. As will be described in more detail below, the member 26 may be initially planar (FIG. 1 and FIG. 2) before it is formed into a curved configuration, or it may have a curved configuration (FIG. 3) and serve as a form against which the first substrate 12 (or first and second substrates 12, 14) are urged to take on a curved configuration. In FIG. 1 (as well as in FIGS. 2-9), the backlight unit has been omitted for clarity.

FIG. 2 shows the member 26 and the first and second substrates 12, 14 as assembled in contact with each other. In some implementations, the member 26 is adhered to an adjacent substrate. As illustrated in FIG. 2, the member 26 can be adhered to the second substrate 14. In some implementations, the adhesive is not cured until the components have been shaped into their final form.

FIG. 3 shows the assembled member 26 and first and second substrates 12, 14 after being formed or bent into a curved configuration to create the curved display 10. In the schematic view of FIG. 3, the resulting curvature is exaggerated for clarity. In the implementation shown in FIG. 3, the member 26 can be maintained as part of the curved display. For example, the member 26 can be a frame member (including a chassis) or a cover lens.

Figure 4:
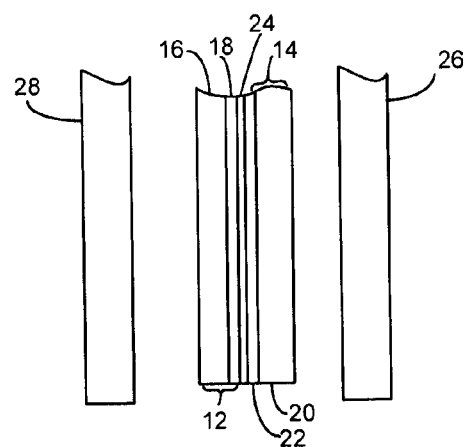
FIGS. 4, 5 and 6 are schematic side views similar to FIGS. 1, 2 and 3, but showing another implementation of the curved display.
Figure 5:
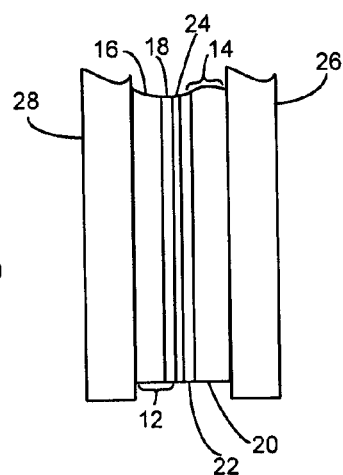
Figure 6:
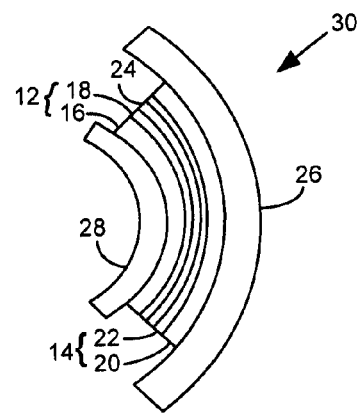

FIGS. 4, 5 and 6 are schematic views of a curved display 30 that is similar to the curved display 10, except the curved display 30 is formed with two support or forming members, i.e., the members 26, 28, on its inner and outer sides. In FIG. 5, the members are shown in their assembled condition adjacent the first substrate 12 and the second substrate 14, respectively. As in the above implementation, adhesive may be applied between one or both of the members and the adjacent substrate. In FIG. 6, the assembly of the members 26, 28 and the substrates 12, 14 is shown after it has been deformed or bent into a curved configuration to create the curved display 30.

In the implementation shown in FIG. 6, the members 26, 28 can be maintained as part of the curved display, or different curved members could be substituted. For example, one of the members could be a cover lens and the other of the members could be a frame member (e.g., chassis). For a concave display, the member 28 could be configured as a cover lens (or other intermediate component on the working side of the display), and the member 26 could be configured as a frame component or other internal component.

Figure 7A:
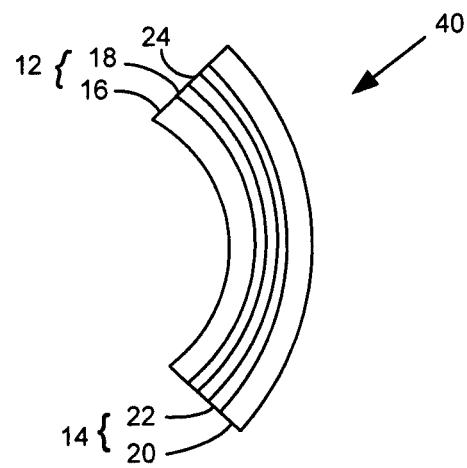
FIG. 7A is a schematic side view showing another implementation of the curved display.

FIG. 7A is a schematic view of another implementation in which a curved display module 40 does not have any supporting members. Thus, it is at least one curved substrate that provides the curved configuration in the resulting curved display module. More specifically, in the implementation of FIG. 7A, it is the first substrate 12 and the second substrate 14 that together define the curved display module 40. Each substrate is formed in a curved shape, such as by using a curved member, and then an assembly of both completed substrates with the liquid crystal material sealed between the substrates is produced. The curved display module 40 can be used with a curved cover lens, or, in some cases with a planar cover lens that is urged into a curved shape by the display module.

Figure 7B:
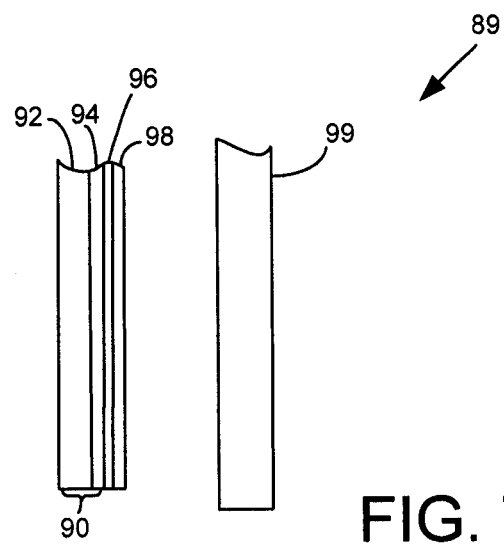
FIG. 7B is a schematic side view of a curved display implemented using OLED technology.

FIG. 7B is a schematic side view of an implementation of a curved display formed with OLED technology. Some available OLEDs have polyimide substrates and flexible encapsulation, so they can experience more shear stress without failure than more conventional OLEDs having a frit edge seal, but currently only lower yields of such OLEDs are possible.

The OLED curved display of FIG. 7B, which is shown during assembly and before being shaped into the final curved configuration, however, has a glass TFT array backplane topped with flexible encapsulant. This configuration serves to both reduce the overall cost and yield losses associated with debonding plastic substrates while at the same time overcoming the fragility of glass fit seals.

As shown, there is a display backplane 90, which is comprised of a thin glass substrate 92 and a TFT array 94 and its associated circuitry. A stack of OLED materials 96 is positioned adjacent the TFT array 94. An encapsulating layer or moisture and oxygen barrier 98, which can be formed of alternating layers is organic and inorganic materials, is provided over the stack of OLED materials 96. In a subsequent step, the intermediate assembly on the left is assembled together with a cover lens (or other shaping structure), which is represented at 99 on the right side and before it has been formed to have a curved configuration.

FIGS. 8 and 9 are top plan and side elevation views, respectively, of a curved display 50 according to another embodiment. As shown in FIG. 8, there is a first substrate 44 (sometimes referred to as a "top glass") that is aligned with and adjacent a second substrate 42 (sometimes referred to as a "bottom glass"), which together form a sandwich construction with a liquid crystal layer 43 between the substrates 44, 42.

One of the substrates has an extended portion for mounting a display ASIC or circuit component 52. As shown, the second substrate 42 has an extended portion that provides a space to mount the display circuit component 53. In some implementations, the curved display 50 can be formed such that there is a planar extended section 46 extending from a remaining portion 48 that is free to be formed into the curved configuration as shown in the schematic side view of FIG. 10. In this way, the planar section 46 provides for secure mounting of the display circuit component 52 and reliable electrical connections without requiring changes to the display circuit component 52, which can have a conventional configuration. Any supporting structure, such as a fixture or frame member, can also be formed to have a corresponding planar section to support the planar section 46. In other implementations, the substrate is continuously and more moderately curved such that die bonding or other operations to attach the circuit component 52 can be completed without providing a separate planar section.

As described above, the display can be fabricated to have a curved configuration. In some implementations, adhesive is applied between various components and they are then formed into the curved configuration before the adhesive is cured. For example, in implementations with two substrates, a UV-curable adhesive can be applied between the substrates while they are in their substantially planar state. The assembly is then formed into the curved configuration, and the adhesive is cured, which tends to make the pressure between the substrates more even and avoid sheering among the individual layers.

To implement these techniques for production, it may be advantageous to have the motherglass substrates singulated prior to cell assembly and then cleaned and dried prior to receiving any adhesive or epoxy. Conventional epoxy dispensers may need to be reconfigured to apply epoxy to substrates that have already been singulated. In some implementations, the epoxied assemblies are supported in curved fixtures until the epoxy is sufficiently cured. It can be advantageous to make the fixtures transparent to UV light such that the curing can take place while the substrates are held in the fixtures. In some implementations, the fixtures are then removed.

As also described above, once the substrate(s) has been bent or formed into the curved configuration, it can be secured to a curved element or member that remains in place in the final curved display. For example, the curved element or member can support the front side of the curved display, which may comprise the display element, touch layers and cover glass, which may be laminated together. This curved element can be designed, e.g., as a cover lens in a predefined curved shape, such as a curved cover lens molded of glass. A different curved element or member can be provided to support the rear side of the display or its frame, such as through the reflector and light guide, which may be laminated together. The curved element for the rear side can be configured as a frame element, chassis or other internal component. The various components can be held in their desired positions to create the curved configuration by using suitable mechanical fastening arrangements. Maintaining uniform pressure over the full extent of the display results in better performance.

As indicated, adhesive is used between some of the components in some implementations. In some implementations, a resulting layer of adhesive can be thicker, such as if the cover lens has topology because a touchscreen is formed on its inner surface. Thus, the adhesive layer(s) can be effective to fill gaps of about 0.02 mm to about 0.09 mm.

Also, one or more layers of foam or other resilient material can be introduced into the assembly to assist in making the pressure exerted on the substrate(s) more even. For example, closed cell foam installed over an inner side member or chassis allows for better assembly of the substrate onto the inner side member because the foam deforms slightly as required to even out slight deformities in the substrate or the member and prevents too much pressure from being applied to the display element.

Figure 11:
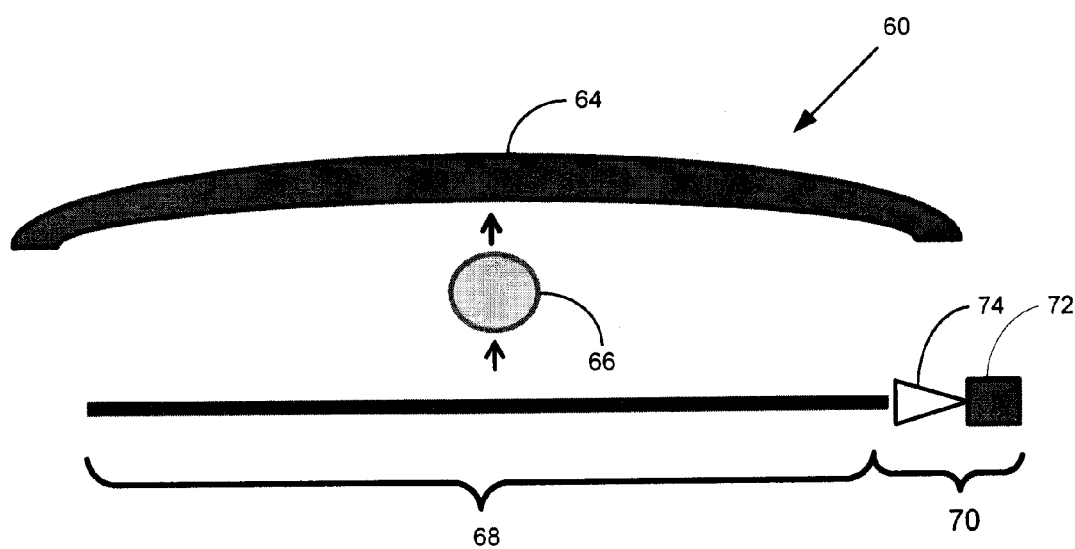
FIGS. 11, 12 and 13 are schematic side elevation views of a curved display being assembled according to a conventional method.
Figure 12:
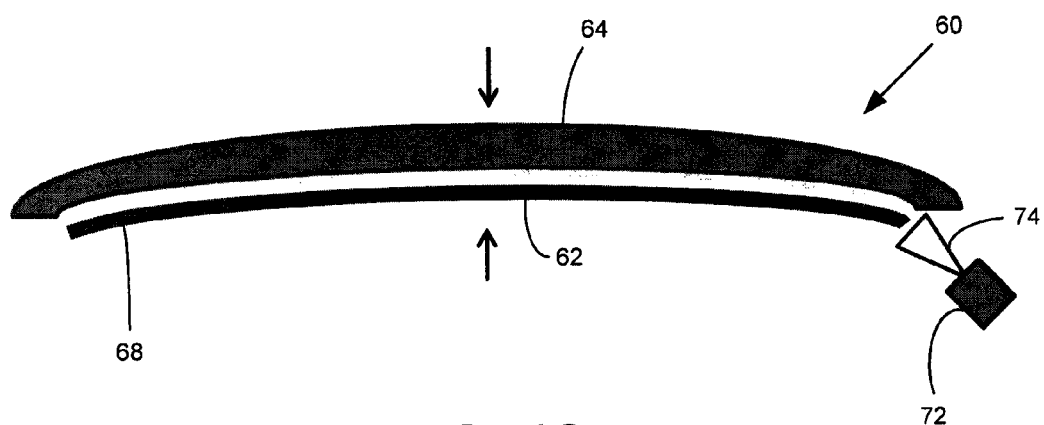
Figure 13:
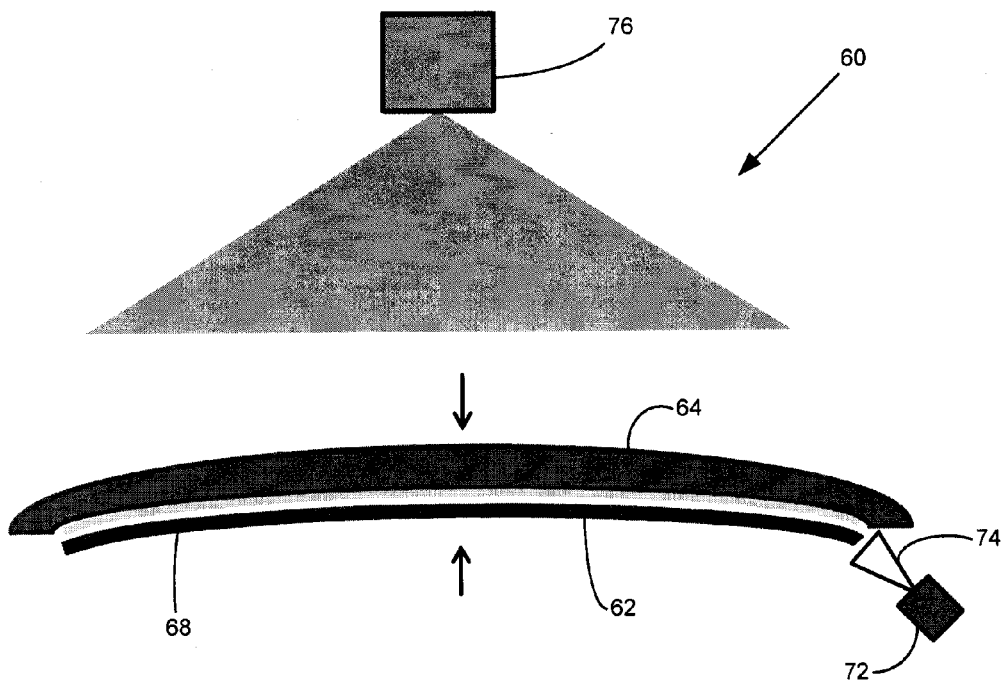

FIGS. 11-16 depict another example of a curved display and assembly methods suitable for production. FIGS. 11-13 are schematic side elevation views of a curved display 60 being assembled. As shown in FIG. 11, a display component 62 is aligned with a cover lens 64, and adhesive 66 is applied between these elements. The display component 62 can be a LCD display component that is capable of operating after being slightly bent or deformed from a planar configuration as shown in FIG. 11 into a curved configuration (e.g., as shown in FIG. 12). Specifically, the display component 62 has one or more substrates having a curvable section 68 and a longitudinally adjacent planar section 70, such as is described above in FIG. 10. An LED array 72 is mounted on the planar section 70 at a position slightly spaced from the end of the curvable section 68. The LED array 72 serves to illuminate the display component 62, as indicated by the triangular schematic illumination cone 74.

Figure 14:
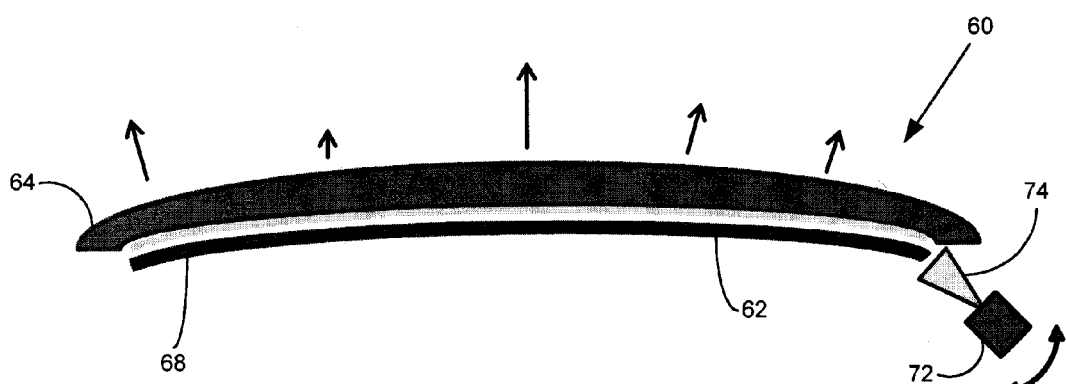
FIG. 14 is a schematic side elevation view of the curved display of FIGS. 11-13 being adjusted to increase the uniformity of its brightness.

As indicated in FIG. 12, clamping force is applied to the cover lens 64 and the display component 62 (either directly or indirectly) to cause the curvable section 68 to deform as desired to generally follow the cover lens 64 and promote good adhesion between the cover lens 64 and the curvable section 68. In FIG. 13, a source of UV light 76 is directed onto the adhesive through the cover lens 64 to cure the adhesive. In FIG. 14, after the adhesive is cured, the performance of the display component 62 is evaluated. In particular, the LED array is connected so that it can provide illumination throughout the display component, and the resulting brightness is checked. As indicated schematically by the arrows, a display component with less than desired uniformity of brightness will have noticeable bright spots and dark spots.

It has been discovered that the uniformity of brightness in the display component 62 can be adjusted to an acceptable degree in many circumstances by moving the planar section 70. As shown in FIG. 14, a force can be applied, e.g., to urge the LED 72 array/end of the planar section 70 to rotate very slightly in one direction or the other, thus causing the coupling with the attached curvable section 68 to deform slightly and thus change the brightness of the display. When the adjustment takes place after the adhesive has cured, however, it must be done delicately and typically in a manual fashion. Also, it can be difficult to retain the display component in its adjusted position when the applied force is removed once the adhesive is already cured.

Figure 15:
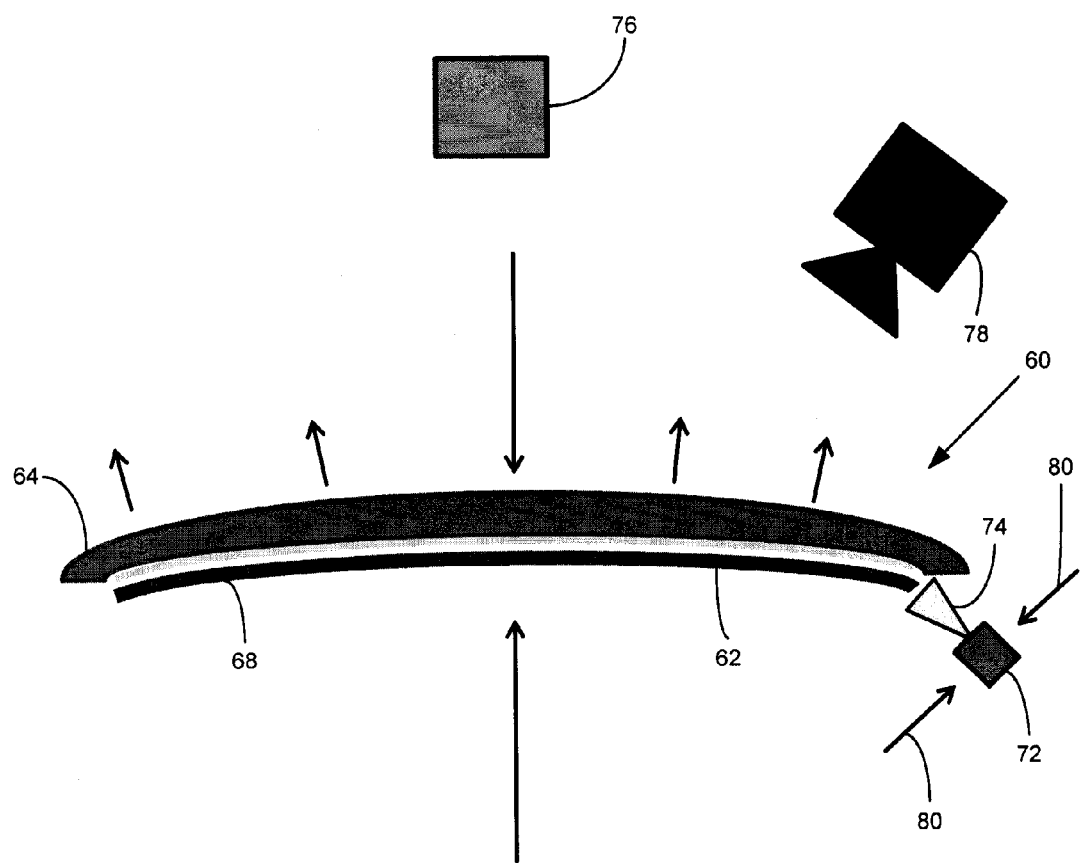
FIG. 15 is a schematic side elevation view of a curved display being assembled according to a new method.
Figure 16:
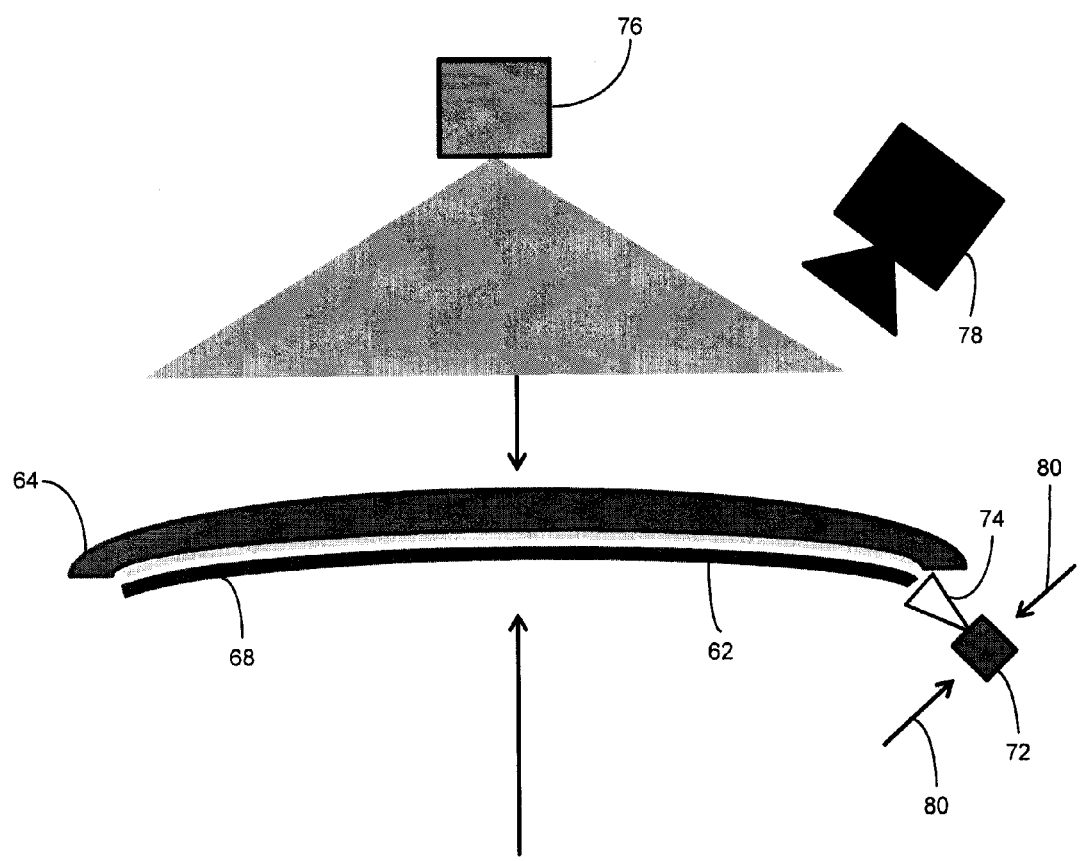
FIG. 16 is a schematic side elevation view of the curved display of FIG. 15 being adjusted automatically to increase the uniformity of its brightness.

FIGS. 15 and 16 are schematic side elevation views of the curved display 60 being assembled according to another method. In FIG. 15, a camera 78 is focused on the cover lens 64 and the display component 62 to measure changes in the brightness of the display component. The display component 62 in this example has an array of backlight LEDs. After the display component 62 and the cover lens are clamped together, but before the adhesive is cured, the display component's backlight LEDs are illuminated and the camera records the displayed brightness pattern. The brightness pattern information is processed to determine if it is acceptably uniform. If not, a program automatically controls a pair of actuators 80 to move the planar section 70 and the brightness uniformity is evaluated again. This process is continued until a best possible brightness uniformity is achieved, such as by using a feedback loop. Optionally, the process can also be ended after a predetermined time or number of cycles. Once the adjustment process is complete, the program controls the source of UV radiation to emit UV light as shown in FIG. 16 to cure the adhesive and thus secure the assembly together with the curvable section 68 in the adjusted position. In this way, a relatively low cost curved display is achieved from a standard display component that is bent into a curved configuration, automatically adjusted to have acceptable brightness uniformity and then secured in the adjusted position.

In implementations where one or more substrates are bent or formed into the curved configuration, using very thin glass layers (including TFT and CF layers) that are sealed when in their planar configurations makes fabrication possible using existing liquid crystal assembly equipment. Some sheering may take place in and among the various layers of the curved display as formed, but the display remains highly functional and the sheering may not be noticeable to the user.

Any light guide present in the curved display can be adapted as appropriate for the curved configuration. For example, the light guide can be modified as necessary to provide for more even distribution of light from the backlight throughout the display. In some implementations, the light guide can be provided with a new pattern of surface features designed to reduce light loss due to exit angle changes resulting from the curved configuration. In some implementations, optical modeling software can be used instead of or in conjunction with changes to the light guide and other similar elements to ensure adequate illumination uniformity and optical properties in the curved display.

The curved display format provides many advantages. In implementations of a concave display, a user-facing camera on the curved display is pointed slightly down (or slightly up) and thus is more direct pointed at the user in most circumstances compared to such a camera on a flat display, which often tends to be pointing above or below the user's face. Having a user-facing camera that more naturally captures the face is advantageous in applications that use the camera, such as two-way video calling.

The curved display also improves some detection operations. For example, a detector grid in a curved display configured to detect finger height and angle of approach has better performance than a similar grid in a flat display because of the geometry of the concave display. In an implementation with a hover touch detector grid that detects finger height and angle of approach by relative signal strength, the detectors in a curved display have greater signal strength when the finger is very close to the display and thus exhibit better performance.

As described above, a flat substrate (or display module comprising flat substrates) can be formed into a curved shape (1) by being placed between a curved cover lens and a curved internal member such as a chassis, (2) by being urged, together with a flat cover lens, over a curved internal member or chassis and then formed to the curve configuration or (3) by being urged into a curved cover lens, thereby creating a curved display. As also described, the curved display can be achieved by using a curved display module formed from substrates that are formed to have a curved configuration, and then fitting the curved display module in a curved cover lens or using the curved display module to form a flat cover lens into a curved cover lens as assembled.

Figure 17:
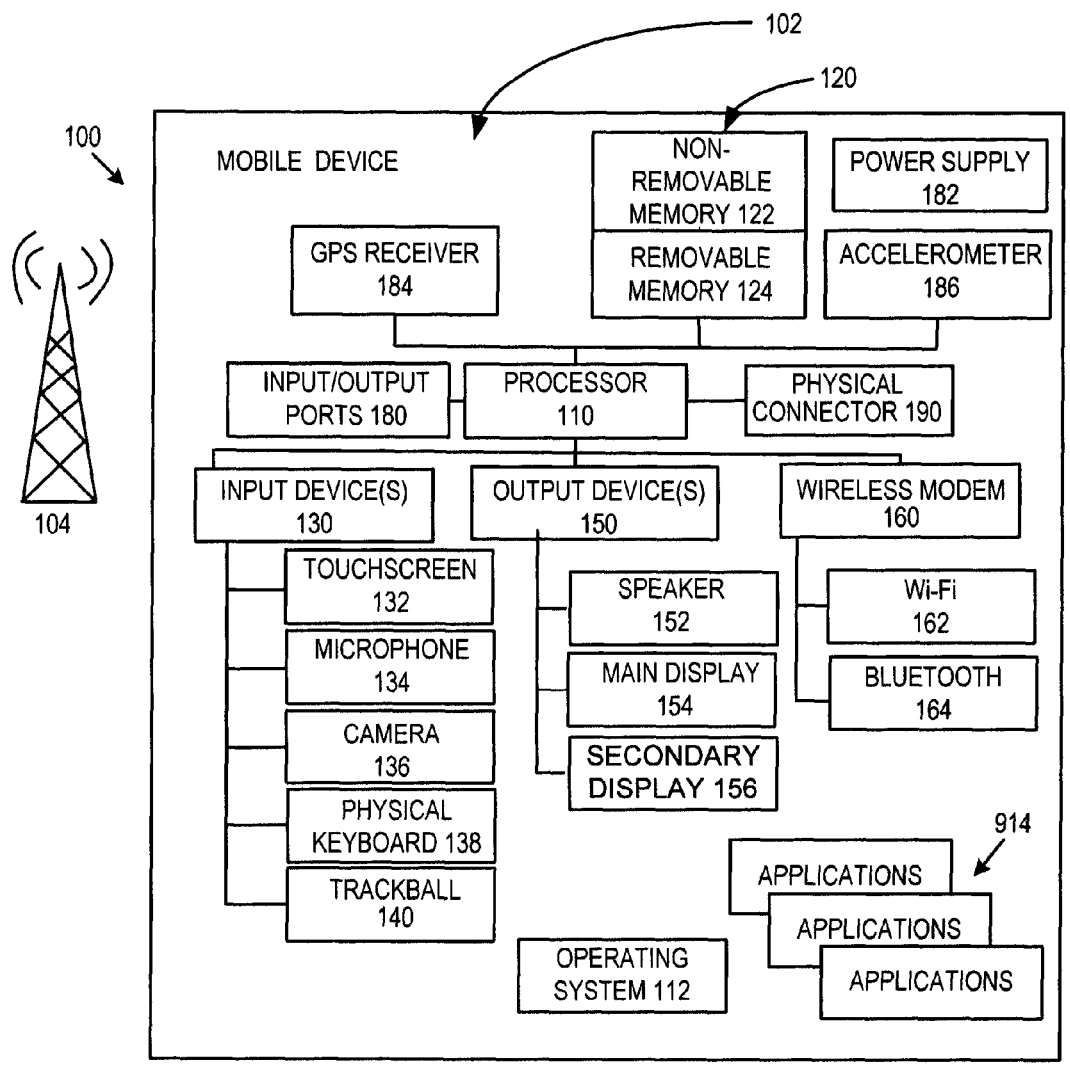
FIG. 17 is a schematic diagram depicting an exemplary mobile device with which any of the disclosed embodiments can be implemented.

FIG. 17 is a system diagram depicting an exemplary mobile device 100 including a variety of optional hardware and software components, shown generally at 102. Any components 102 in the mobile device can communicate with any other component, although not all connections are shown, for ease of illustration. The mobile device can be any of a variety of computing devices (e.g., cell phone, smartphone, handheld computer, Personal Digital Assistant (PDA), etc.) and can allow wireless two-way communications with one or more mobile communications networks 104, such as a cellular or satellite network.

The illustrated mobile device 100 can include a controller or processor 110 (e.g., signal processor, microprocessor, ASIC, or other control and processing logic circuitry) for performing such tasks as signal coding, data processing, input/output processing, power control, and/or other functions. An operating system 112 can control the allocation and usage of the components 102 and support for one or more application programs 114. The application programs can include common mobile computing applications (e.g., email applications, calendars, contact managers, web browsers, messaging applications), or any other computing application. Functionality 113 for accessing an application store can also be used for acquiring and updating applications 114.

The illustrated mobile device 100 can include memory 120. Memory 120 can include non-removable memory 122 and/or removable memory 124. The non-removable memory 122 can include RAM, ROM, flash memory, a hard disk, or other well-known memory storage technologies. The removable memory 124 can include flash memory or a Subscriber Identity Module (SIM) card, which is well known in GSM communication systems, or other well-known memory storage technologies, such as "smart cards." The memory 120 can be used for storing data and/or code for running the operating system 112 and the applications 114. Example data can include web pages, text, images, sound files, video data, or other data sets to be sent to and/or received from one or more network servers or other devices via one or more wired or wireless networks. The memory 120 can be used to store a subscriber identifier, such as an International Mobile Subscriber Identity (IMSI), and an equipment identifier, such as an International Mobile Equipment Identifier (IMEI). Such identifiers can be transmitted to a network server to identify users and equipment.

The mobile device 100 can support one or more input devices 130, such as a touchscreen 132, microphone 134, camera 136, physical keyboard 138 and/or trackball 140 and one or more output devices 150, such as a speaker 152, a main display 154, and/or one or more secondary displays 156. Other possible output devices (not shown) can include piezoelectric or other haptic output devices. Some devices can serve more than one input/output function. For example, touchscreen 132 and displays 154, 156 can be combined in a single input/output device. The input devices 130 can include a Natural User Interface (NUI). An NUI is any interface technology that enables a user to interact with a device in a "natural" manner, free from artificial constraints imposed by input devices such as mice, keyboards, remote controls, and the like. Examples of NUI methods include those relying on speech recognition, touch and stylus recognition, gesture recognition both on screen and adjacent to the screen, air gestures, head and eye tracking, voice and speech, vision, touch, gestures, and machine intelligence. Other examples of a NUI include motion gesture detection using accelerometers/gyroscopes, facial recognition, 3D displays, head, eye, and gaze tracking, immersive augmented reality and virtual reality systems, all of which provide a more natural interface, as well as technologies for sensing brain activity using electric field sensing electrodes (EEG and related methods). Thus, in one specific example, the operating system 112 or applications 114 can comprise speech-recognition software as part of a voice user interface that allows a user to operate the device 100 via voice commands. Further, the device 100 can comprise input devices and software that allows for user interaction via a user's spatial gestures, such as detecting and interpreting gestures to provide input to a gaming application.

A wireless modem 160 can be coupled to an antenna (not shown) and can support two-way communications between the processor 110 and external devices, as is well understood in the art. The modem 160 is shown generically and can include a cellular modem for communicating with the mobile communication network 104 and/or other radio-based modems (e.g., Bluetooth 164 or Wi-Fi 162). The wireless modem 160 is typically configured for communication with one or more cellular networks, such as a GSM network for data and voice communications within a single cellular network, between cellular networks, or between the mobile device and a public switched telephone network (PSTN).

The mobile device can further include at least one input/output port 180, a power supply 182, a satellite navigation system receiver 184, such as a Global Positioning System (GPS) receiver, an accelerometer 186, and/or a physical connector 190, which can be a USB port, IEEE 1394 (FireWire) port, and/or RS-232 port. The illustrated components 102 are not required or all-inclusive, as any components can be deleted and other components can be added.

Figure 18:
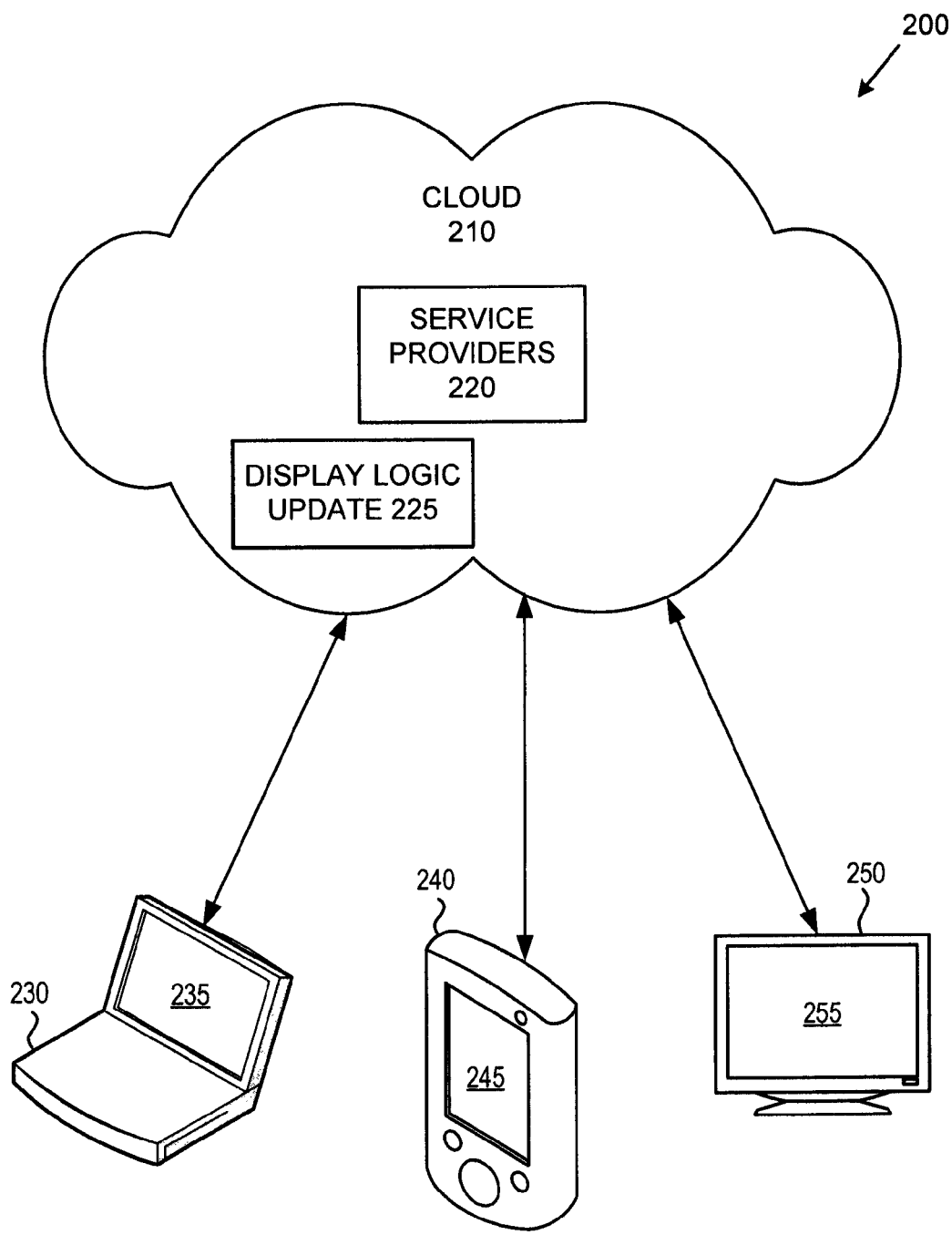
FIG. 18 is a schematic diagram illustrating a generalized example of a suitable implementation environment for any of the disclosed embodiments.

FIG. 18 illustrates a generalized example of a suitable implementation environment 200 in which described embodiments, techniques, and technologies may be implemented.

In example environment 200, various types of services (e.g., computing services) are provided by a cloud 210. For example, the cloud 210 can comprise a collection of computing devices, which may be located centrally or distributed, that provide cloud-based services to various types of users and devices connected via a network such as the Internet. The implementation environment 200 can be used in different ways to accomplish computing tasks. For example, some tasks (e.g., processing user input and presenting a user interface) can be performed on local computing devices (e.g., connected devices 230, 240, 250) while other tasks (e.g., storage of data to be used in subsequent processing) can be performed in the cloud 210.

In example environment 200, the cloud 210 provides services for connected devices 230, 240, 250 with a variety of screen capabilities. Connected device 230 represents a device with a computer screen 235 (e.g., a mid-size screen). For example, connected device 230 could be a personal computer such as desktop computer, laptop, notebook, netbook, or the like. Connected device 240 represents a device with a mobile device screen 245 (e.g., a small size screen). For example, connected device 240 could be a mobile phone, smart phone, personal digital assistant, tablet computer, or the like. Connected device 250 represents a device with a large screen 255. For example, connected device 250 could be a television screen (e.g., a smart television) or another device connected to a television (e.g., a set-top box or gaming console) or the like. One or more of the connected devices 230, 240, 250 can include touchscreen capabilities. Touchscreens can accept input in different ways. For example, capacitive touchscreens detect touch input when an object (e.g., a fingertip or stylus) distorts or interrupts an electrical current running across the surface. As another example, touchscreens can use optical sensors to detect touch input when beams from the optical sensors are interrupted. Physical contact with the surface of the screen is not necessary for input to be detected by some touchscreens. Devices without screen capabilities also can be used in example environment 200. For example, the cloud 210 can provide services for one or more computers (e.g., server computers) without displays.

Services can be provided by the cloud 210 through service providers 220, or through other providers of online services (not depicted). For example, cloud services can be customized to the screen size, display capability, and/or touchscreen capability of a particular connected device (e.g., connected devices 230, 240, 250). In some embodiments, connected devices having more than one display can communicate with the cloud 210 to receive updates 225 and/or changes to their display logic, such as the change way in which the different screens are used to perform various functions.

In example environment 200, the cloud 210 provides the technologies and solutions described herein to the various connected devices 230, 240, 250 using, at least in part, the service providers 220. For example, the service providers 220 can provide a centralized solution for various cloud-based services. The service providers 220 can manage service subscriptions for users and/or devices (e.g., for the connected devices 230, 240, 250 and/or their respective users).

Figure 19:
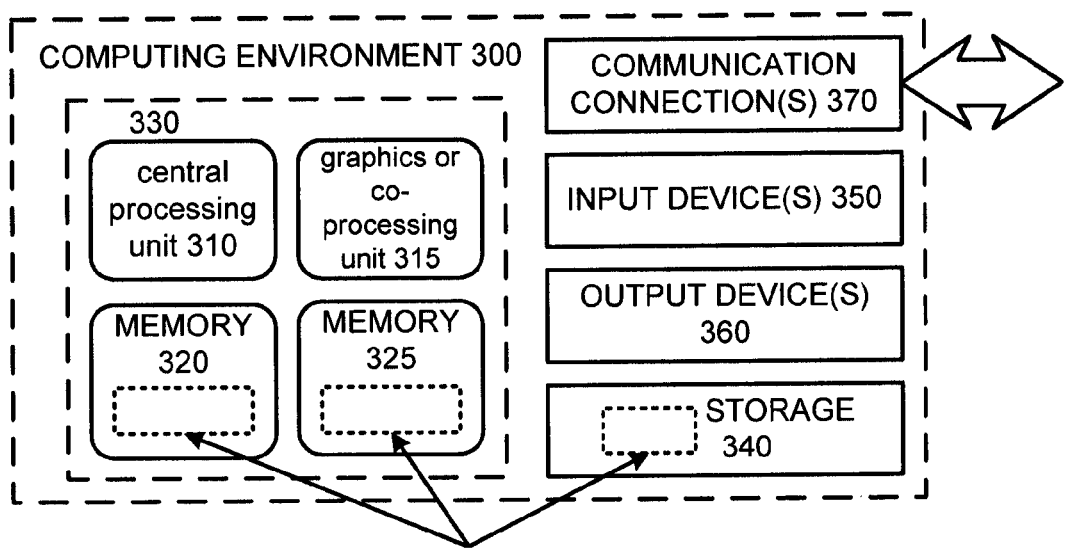
FIG. 19 is a schematic diagram illustrating a generalized example of a suitable computing environment for any of the disclosed embodiments.

FIG. 19 depicts a generalized example of a suitable computing environment 300 in which the described innovations may be implemented. The computing environment 300 is not intended to suggest any limitation as to scope of use or functionality, as the innovations may be implemented in diverse general-purpose or special-purpose computing systems. For example, the computing environment 300 can be any of a variety of computing devices (e.g., desktop computer, laptop computer, server computer, tablet computer, media player, gaming system, mobile device, etc.)

With reference to FIG. 13, the computing environment 300 includes one or more processing units 310, 315 and memory 320, 325. In FIG. 3, this basic configuration 330 is included within a dashed line. The processing units 310, 315 execute computer-executable instructions. A processing unit can be a general-purpose central processing unit (CPU), a graphics processing unit (GPU), a processor in an application-specific integrated circuit (ASIC), or any other type of processor. In a multi-processing system, multiple processing units execute computer-executable instructions to increase processing power. For example, FIG. 19 shows a central processing unit 310 as well as a graphics processing unit or co-processing unit 315. The tangible memory 320, 325 may be volatile memory (e.g., registers, cache, RAM), non-volatile memory (e.g., ROM, EEPROM, flash memory, etc.), or some combination of the two, accessible by the processing unit(s). The memory 320, 325 stores software 380 implementing one or more innovations described herein, in the form of computer-executable instructions suitable for execution by the processing unit(s).

A computing system may have additional features. For example, the computing environment 300 includes storage 340, one or more input devices 350, one or more output devices 360, and one or more communication connections 370. An interconnection mechanism (not shown) such as a bus, controller, or network interconnects the components of the computing environment 300. Typically, operating system software (not shown) provides an operating environment for other software executing in the computing environment 300, and coordinates activities of the components of the computing environment 300.

The tangible storage 340 may be removable or non-removable, and includes magnetic disks, magnetic tapes or cassettes, CD-ROMs, DVDs, or any other storage device which can be used to store information and which can be accessed within the computing environment 300. The storage 340 stores instructions for the software 380 implementing one or more innovations described herein.

The input device(s) 350 may be a touch input device such as a touchscreen, keyboard, mouse, pen, or trackball, a voice input device, a scanning device, or another device that provides input to the computing environment 300. For video encoding, the input device(s) 350 may be a camera, video card, TV tuner card, or similar device that accepts video input in analog or digital form, or a CD-ROM or CD-RW that reads video samples into the computing environment 300. The output device(s) 360 may be one or more displays, printer, speaker, CD-writer, or another device that provides output from the computing environment 300.

The communication connection(s) 370 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods.

Any of the disclosed methods can be implemented as computer-executable instructions stored on one or more computer-readable storage media (e.g., one or more optical media discs, volatile memory components (such as DRAM or SRAM), or nonvolatile memory components (such as flash memory or hard drives)) and executed on a computer (e.g., any commercially available computer, including smart phones, tablets, or other mobile devices that include computing hardware). As should be readily understood, the term computer-readable storage media does not include communication connections, such as modulated data signals. Any of the computer-executable instructions for implementing the disclosed techniques as well as any data created and used during implementation of the disclosed embodiments can be stored on one or more computer-readable media (which excludes propagated signals). The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network), or other such network) using one or more network computers.

For clarity, only certain selected aspects of the software-based implementations are described. Other details that are well known in the art are omitted. For example, it should be understood that the disclosed technology is not limited to any specific computer language or program. Certain details of suitable computers and hardware are well known and need not be set forth in detail in this disclosure.

It should be also well understood that any functionality described herein can be performed, at least in part, by one or more hardware logic components, instead of software. For example, and without limitation, illustrative types of hardware logic components that can be used include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), etc.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

The disclosed methods, apparatus, and systems should not be construed as limiting in any way. Instead, the present disclosure is directed toward all novel and nonobvious features and aspects of the various disclosed embodiments, alone and in various combinations and subcombinations with one another. The disclosed methods, apparatus, and systems are not limited to any specific aspect or feature or combination thereof, nor do the disclosed embodiments require that any one or more specific advantages be present or problems be solved.

In view of the many possible embodiments to which the principles disclosed herein may be applied, it should be recognized that the illustrated embodiments are only preferred examples and should not be taken as limiting the scope of the disclosure. Rather, the scope of the disclosure is defined by the following claims. We therefore claim all that comes within the scope of these claims.

We claim:

1. A curved display for an electronic device, comprising:
a main substrate comprising a first curved section extending from a first end of the main substrate and a longitudinally adjacent second planar section extending to define a second end of the main substrate opposite the first end,
wherein the first curved section comprises at least one flat glass member bent into a curved configuration, and wherein the second planar section comprises a flat segment of the flat glass member;
a display circuit component mounted to an upper surface of the second planar section, the display circuit component being positioned within and spaced from edges of the second planar section;
a liquid crystal layer positioned over the first curved section;
a secondary substrate comprising a flat glass member bent into a curved configuration and secured to the first curved section of the main substrate with the liquid crystal layer positioned between the first curved section of the main substrate and the secondary substrate.

2. The curved display of claim 1, wherein the secondary substrate is a top glass and the main substrate is a bottom glass.

3. The curved display of claim 1, wherein the secondary substrate is adhered to the first curved section of the main substrate with a UV curable adhesive.

4. The curved display of claim 3, wherein the adhesive is effective to fill a gap of 0.02 mm to 0.10 mm between the secondary substrate and the first curved section of the main substrate.

5. The curved display of claim 1, wherein the display circuit component comprises a display ASIC.

6. The curved display of claim 1, further comprising a resilient member positioned between the secondary substrate and the main substrate.

7. The curved display of claim 1, wherein the curved configuration of first curved section of the first substrate has a radius of curvature of about 200mm to about 1000 mm.

8. The curved display of claim 1, wherein the flat glass member of at least one of the main substrate and the secondary substrate has a thickness of about 0.05 mm to about 0.30 mm.

* * * * *